US006870742B2

United States Patent
Park et al.

(10) Patent No.: US 6,870,742 B2
(45) Date of Patent: Mar. 22, 2005

(54) SYSTEM BOARD (75) Inventors: Myun-Joo Park, Incheon (KR);
Byung-Se So, Sungnam (KR);
Sang-Won Lee, Gunpo (KR); Jae-Jun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 375 days.

(21) Appl. No.: 10/200,731

(22) Filed: Jul. 22, 2002

(65) Prior Publication Data

US 2003/0039105 A1 Feb. 27, 2003

(30) Foreign Application Priority Data

Aug. 24, 2001 (KR) .......................................... 2001-51449

(51) Int. Cl.[7] .................................................. H05K 7/06
(52) U.S. Cl. ........................ 361/785; 361/788; 174/262
(58) Field of Search .................................. 361/777, 778, 361/780, 785, 788, 794, 803; 326/30; 710/301; 174/262

(56) References Cited

U.S. PATENT DOCUMENTS

| 5,530,623 | A | * | 6/1996 | Sanwo et al. ................ 361/788 |
| 5,571,996 | A | * | 11/1996 | Swamy et al. ............... 174/261 |
| 6,104,629 | A | * | 8/2000 | Wu ............................... 365/63 |
| 6,144,576 | A | * | 11/2000 | Leddige et al. ................ 365/63 |
| 6,317,352 | B1 | * | 11/2001 | Halbert et al. ................. 365/52 |
| 6,411,539 | B2 | * | 6/2002 | Funaba et al. ................. 365/63 |
| 6,438,012 | B1 | * | 8/2002 | Osaka et al. ................... 365/52 |
| 6,674,649 | B2 | * | 1/2004 | McCall et al. .............. 361/788 |

* cited by examiner

*Primary Examiner*—John B. Vigushin
(74) *Attorney, Agent, or Firm*—Mills & Onello, LLP (57) ABSTRACT A system board includes a control unit; connectors arranged in series in one direction and accepting a connecting means for inputting and outputting data; and signal lines connecting the control unit to the connectors and including at least one branch point, wherein sub signal lines branched off at the same branch point are equal in length and/or loads of path from the branch point to the connecting means.

5 Claims, 13 Drawing Sheets

SYSTEM BOARD

CROSS REFERENCE

This application claims the benefit of Korean Patent Application No. 2001-51449, filed on Aug. 24, 2001, under 35 U.S.C. § 119, the entirety of which is hereby incorporated by reference.

BACKGROUND OF THE INVENTION

1. Field of the Invention

The present invention relates to a system board, and more particularly, to a system board having slots in which a control circuit and modules controlled by the control circuit are mounted.

2. Description of Related Art

A system board for use in a computer system includes slots in which memory modules are mounted and a control circuit to control the memory modules. The slots are regularly arranged at a predetermined distance from the control circuit, and are sequentially connected. Therefore, signal line lengths from the control circuit to the respective slots differ from each other.

Such a signal line arrangement does not cause problems where the computer system operates at a low speed. This is because the computer system can operate normally by connecting the control circuit to the corresponding slots without consideration of signal line lengths from the control circuit to the respective slots.

However, in the case in which the computer system operates at a high speed, such a signal line arrangement could limit operational speed of the computer system.

Figure 1:
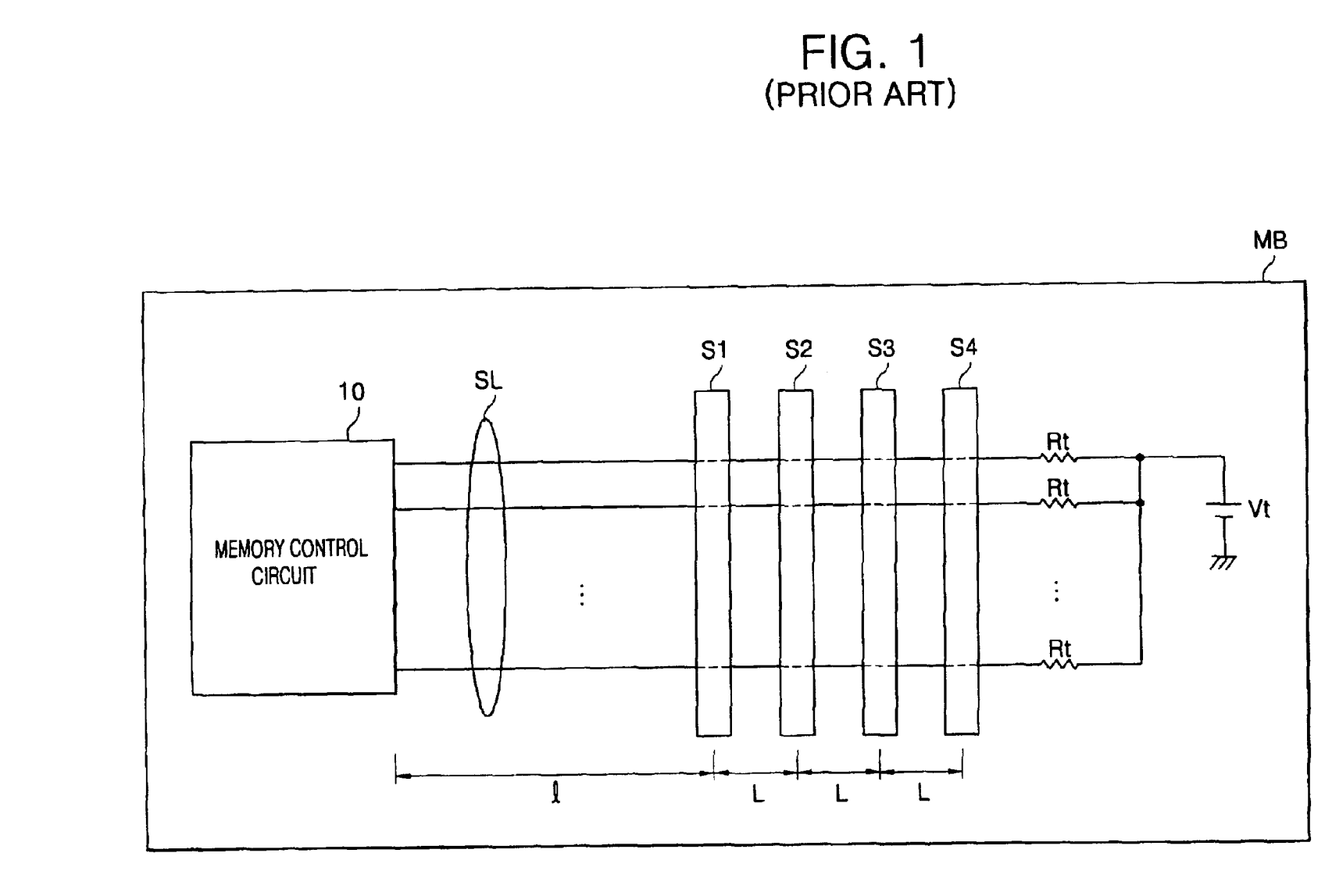
FIG. 1 is a schematic view illustrating a configuration of a conventional system board for use in a computer system.

FIG. 1 is a schematic view illustrating a configuration of a conventional system board for use in a computer system. A main board of the conventional system board includes a memory control circuit 10, slots S1 to S4, signal lines SL, terminal resistors Rt, and a terminal voltage Vt.

First to fourth slots S1 to S4 are successively arranged at a regular interval L. The first slot S1 is arranged at a distance l from the control circuit 10. Signal lines SL are connected to the slots S1 to S4, and the terminal resistors Rt are connected to the corresponding signal lines SL. The terminal voltage Vt is connected to the terminal resistors Rt.

The memory control circuit 10 outputs a command to the slots S1 to S4 via the signal lines SL. The slots S1 to S4 receive or output signals in response to the command from the memory control circuit 10 via the signal lines SL. The terminal resistors Rt and the terminal voltage Vt terminate signals transferred through the signal lines SL.

Figure 2A:
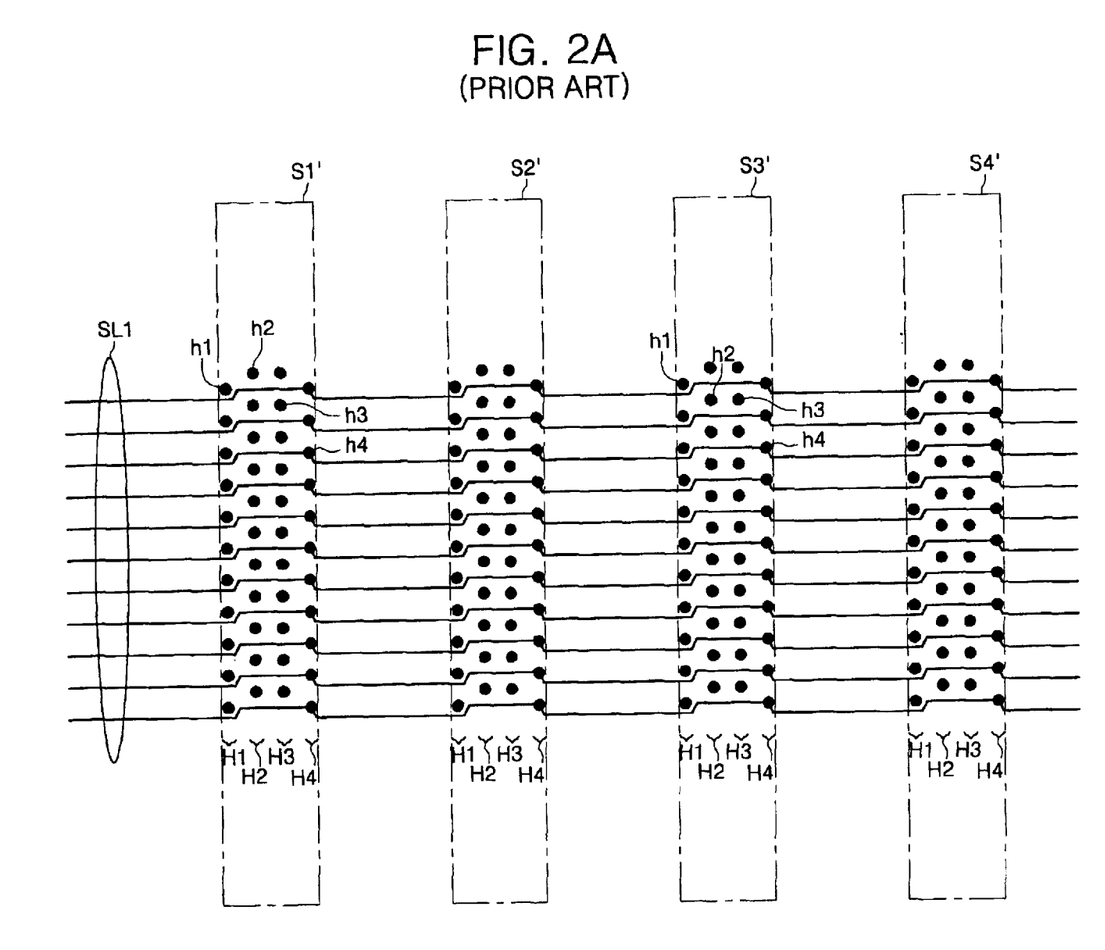
FIGS. 2A and 2B show upper and lower layers of the system board of FIG. 1.
Figure 2B:
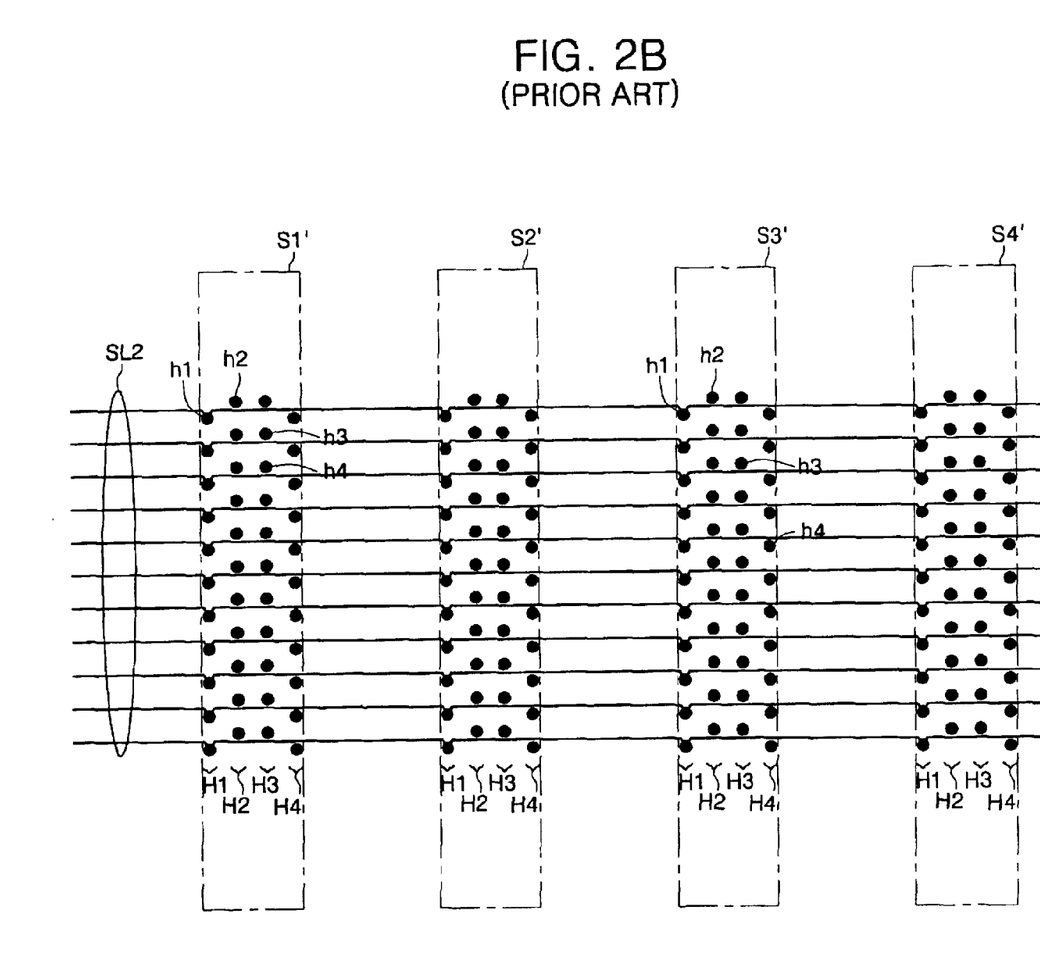

FIGS. 2A and 2B show upper and lower layers of the system board of FIG. 1.

In general, all of the signal lines SL are not arranged on a single layer. The signal lines SL are divided and arranged on two or more layers. For example, as shown in FIGS. 2A and 2B, the signal lines SL are divided into two groups and arranged on two layers.

Regions S1' to S4' denote regions in which the slots S1 to S4 each having 44 pins are mounted, respectively. Signal lines SL1 denote part of the signal lines SL arranged on the upper layer, and signal lines SL2 denote part of the signal lines SL arranged on the lower layer. "h1 to h4" denote via holes arranged in a single row, and "H1 to H4" denote via hole groups each including 11 via holes h1 arranged in a single column. The via holes h1 and h4 are connected to the signal lines, and the via holes h2 and h3 are connected to a ground voltage line and a power voltage line, respectively. The via holes h1 to h4 are filled with a conductive material. Pins of each of the slots S1 to S4 are inserted into the via holes of the via hole groups H1 to H4, respectively, arranged on the regions S1' to S4', whereupon the signal lines SL1 and SL2 are connected to the slots S1 to S4, respectively.

As sown in FIG. 2A, the signal lines SL1 are connected to the via holes h4 of the via hole group H4 arranged on the regions S1' to S4', respectively. As shown in FIG. 2B, the signal lines SL2 are connected to the via holes h1 of the via hole group H1 arranged on the regions S1' to S4', respectively. Even though not shown, the via holes h2 and h3 of the via hole groups H2 and H3 arranged on the regions S1' to S4' are connected to the ground voltage line layer and the power voltage line layer.

As shown in FIGS. 2A and 2B, signal line lengths from the memory control circuit 10 to the slots S1 to S4 depend on a location of the slots S1' to S4'. That is, as a location of the slots S1' to S4' becomes distant from the memory control circuit 10, a length of the signal lines SL between the memory control circuit 10 and the slots S1 to S4 increases.

Figure 3:
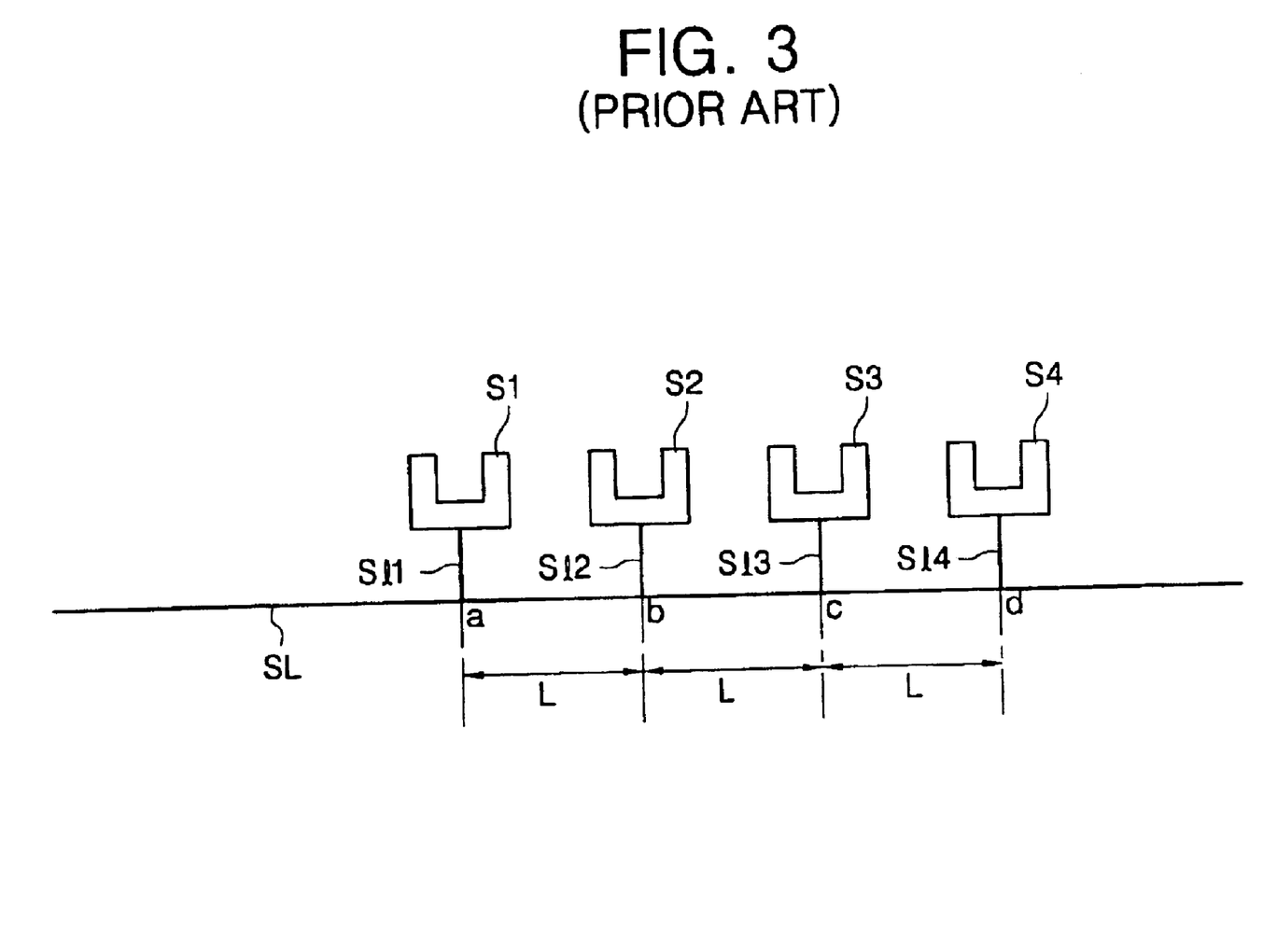
FIG. 3 shows a length of the signal lines according to a location of the slots S1 to S4 of a conventional art.

FIG. 3 shows a length of the signal lines according to a location of the slots S1 to S4. As shown in FIG. 3, a distance between the two adjacent slots is "L". The signal line SL is arranged under the slots S1 to S4 and is branched off at branch points "a" to "d". Branch signal lines sl 1 to sl 4 are connected to the slots S1 to S4. Lengths of the signal line SL from the memory control circuit 10 to the slots S1 to S4 differ. Accordingly, transmission rates of signals transferred from the memory control circuit 10 to the slots S1 to S4 also differ.

Figure 4A:
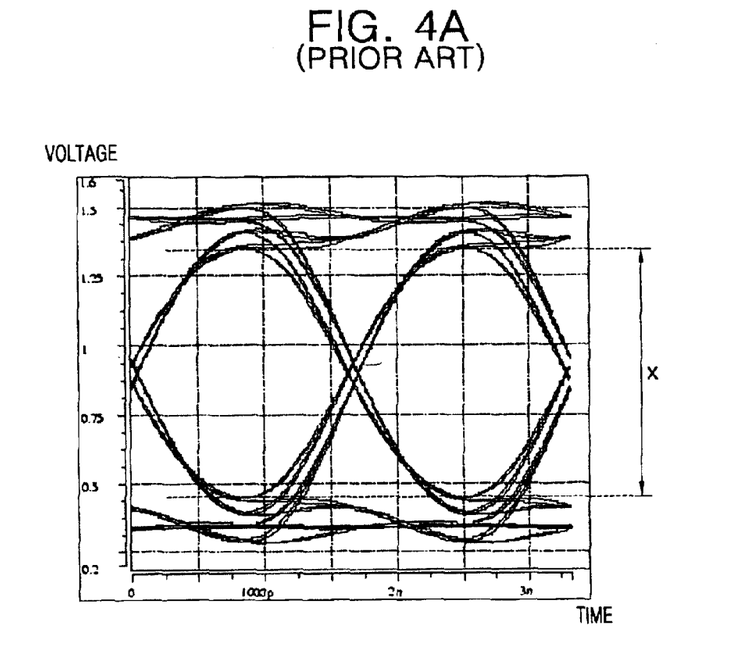
FIG. 4A is a graph illustrating a waveform of a signal transferred from a memory control circuit to a first slot S1.
Figure 4B:
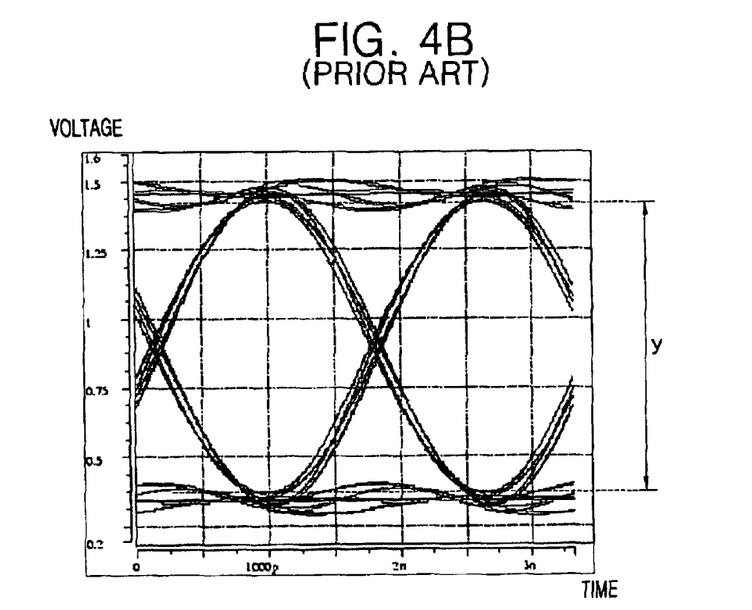
FIG. 4B is a graph illustrating a waveform of a signal transferred from the memory control circuit to a second slot S2.

FIG. 4A is a graph illustrating a waveform of a signal transferred from the memory control circuit 10 to the first slot S1. FIG. 4B is a graph illustrating a waveform of a signal transferred from the memory control circuit 10 to the second slot S2. In FIGS. 4A and 4B, the vertical axis denotes a voltage, and the horizontal axis denotes a time period.

Referring to FIG. 4A, a transmission rate transferred from the memory control circuit 10 to the first slot S1 is fast, whereas an amplitude of a signal voltage is narrow, and therefore an eye opening "x" is small.

The eye opening represents signal transmission characteristics. When the eye opening is large, amplitude of the signal voltage becomes large, and therefore the signal transmission characteristic is good. When the eye opening is small, an amplitude of a signal voltage becomes small, and therefore a signal transmission characteristics is bad.

Accordingly, transmission characteristics of the signal transferred from the memory control circuit 10 to the first slot S1 is bad.

Referring to FIG. 4B, a transmission rate of a signal transferred from the memory control circuit 10 to the slot S2 is slow, and an amplitude of the signal voltage is broad, and therefore an eye opening "y" is large. Accordingly, transmission characteristics of the signal transferred from the memory control circuit 10 to the first slot S2 is good.

As described above, the conventional system board has a problem in that signals transferred to the respective slots have a large transmission rate difference with respect to each other. Therefore, even when one slot among several slots has a bad signal transmission characteristic, due to the slot having a bad signal transmission characteristic, performance of the entire system is limited. Also, since the slots have different signal transmission rates, it is difficult to control a signal timing to receive or output a data at an optimum moment.

SUMMARY OF THE INVENTION

To overcome the problems described above, preferred embodiments of the present invention provide a system board which can improve a signal transmission rate and a signal transmission characteristic.

The present invention is directed to a system board. The system board includes a control unit and connectors arranged in series in one direction and accepting a connecting means for inputting and outputting data. Signal lines connect the control unit to the connectors and include at least one branch point. Sub signal lines branched off at the same branch point are equal in length and/or loads of path from the branch point to the connecting means.

In one embodiment the board further comprises a first layer including first via holes connected to the signal line, the first via holes arranged between regions in which the connectors are mounted; and a second layer including second via holes and third via holes, the second via holes arranged at a corresponding position of the first via holes and connected to the first via holes of the first layer, the third via holes arranged on the regions in which the connectors are mounted and connected to the second via holes through sub signal lines, respectively.

In one embodiment, the board further comprises a first layer including first via holes connected to the signal line, the first via holes arranged between regions in which the connectors are mounted; a second layer including second via holes and third via holes, the second via holes arranged at a corresponding position of the first via holes and connected to the first via holes of the first layer, the third via holes arranged on the regions in which the connectors are mounted, except positions in which the second via holes are arranged, and connected to the second via holes through first sub signal lines, respectively; and a third layer including fourth via holes and fifth via holes, the fourth via holes arranged at a corresponding position of the third via holes and connected to the third via holes of the second layer, the fifth via holes arranged on regions in which the connectors are mounted, except positons in which the fourth via holes are arranged, and connected to the fourth via holes through second sub signal lines, respectively.

In one embodiment, the branch point is two. In one embodiment, the connectors are configured in the form of slots.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFFERED EMBODIMENTS

Reference will now be made in detail to preferred embodiments of the present invention, example of which is illustrated in the accompanying drawings.

Figure 5A:
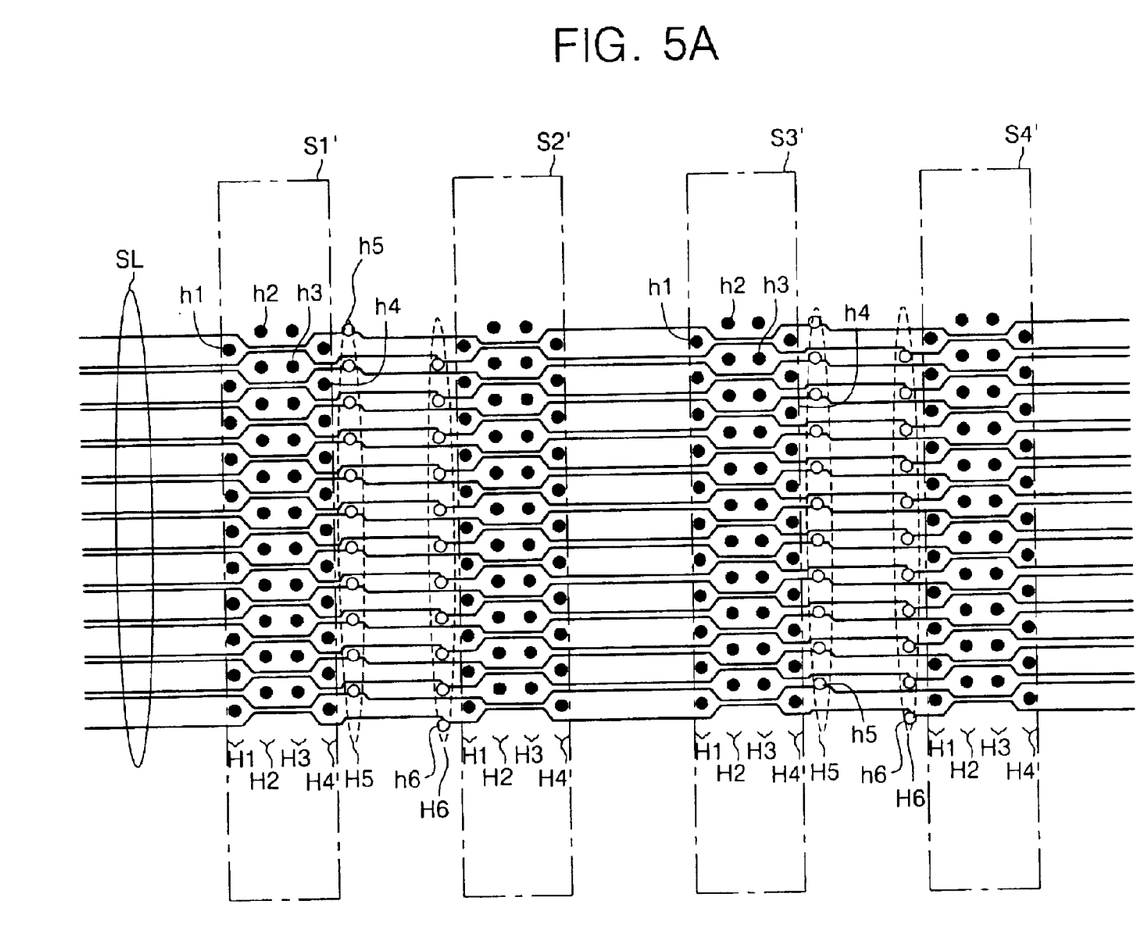
FIGS. 5A and 5B show upper and lower layers of a system board according to one embodiment of the present invention.
Figure 5B:
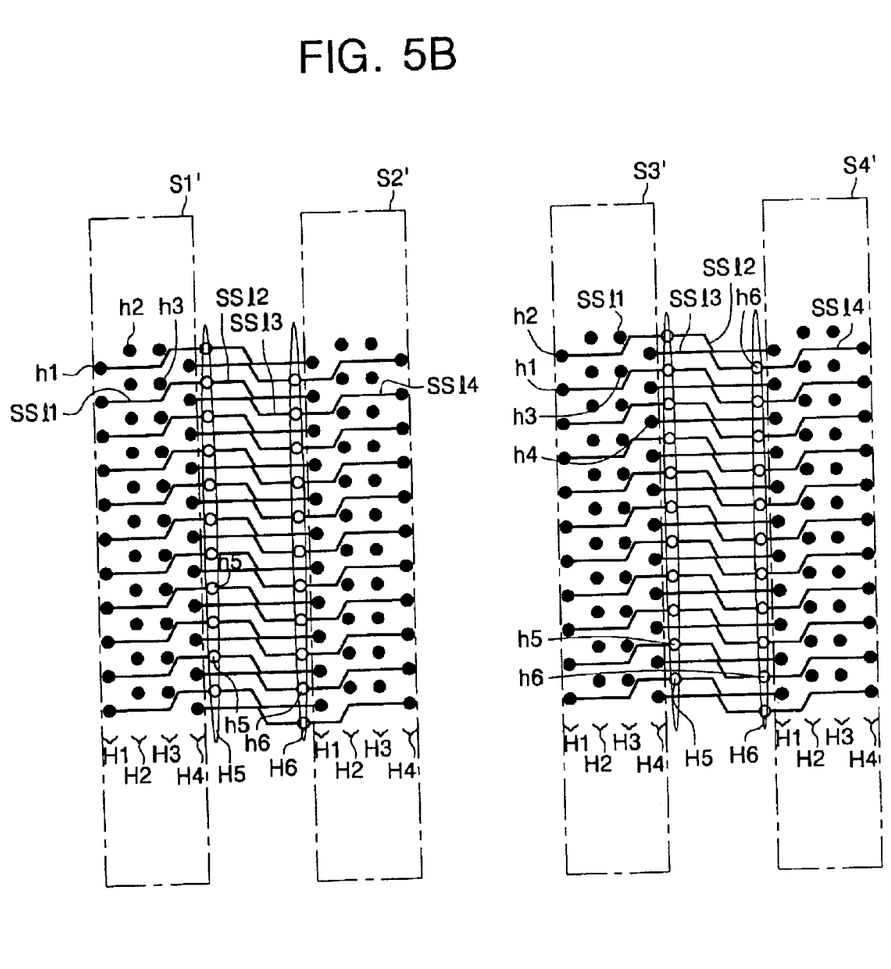

FIGS. 5A and 5B show upper and lower layers of a system board according to one embodiment of the present invention. FIGS. 5A and 5B show two signal line layers except a power voltage line layer and a ground voltage line layer.

Regions S1' to S4' denote regions in which the slots S1 to S4 each having 44 pins are mounted, respectively. Signal lines SL denote the main signal lines of FIG. 1. "h1 to h4" denote via holes arranged in a single row, and "H1 to H4" denote via hole-groups each including 11 via holes h1 arranged in a single column. The via holes h1 and h4 are connected to the signal lines, and the via holes h2 and h3 are connected to ground voltage lines and power voltage lines, respectively. The via holes h1 to h4 are filled with a conductive material. Pins of each of the slots S1 to S4 are inserted into the via holes of the via hole groups H1 to H4, respectively, arranged on the regions S1' to S4', whereupon the signal lines SL1 and SL2 are connected to the slots S1 to S4, respectively. Via holes h5 forming a via hole group H5 are arranged on the right side of the regions S1' and S3' and are filled with the conductive material. Via holes h6 forming a via hole group H6 are arranged on the left side of the regions S2' and S4' and are filled with the conductive material.

In FIG. 5A, the main signal lines SL are connected to the via holes h5 of the via hole group H5 through the regions S1' to S4'. The main signal lines SL are connected to the via holes h6 of the via hole group H6 through the regions S1' to S4'.

The via holes h5 of the via hole group H5 of FIG. 5B are connected to the via holes h5 of the via hole group H5 of FIG. 5A, and the via holes h6 of the via hole group H6 of FIG. 5B are connected to the via holes h6 of the via hole group H6 of FIG. 5A. That is, the via holes h5 and h6 of the via hole groups H5 and H6 are connected to the main signal lines SL of FIG. 5A.

Sub signal lines SSl 1 connect the via holes h1 of the via hole group H1 arranged on the regions S1' and S3' to the via holes h5 of the via hole group H5, respectively. Sub signal lines SSl 2 connect the via holes h5 of the via hole group H5 to the via holes h1 of the via hole group H1 arranged on the regions S2' and S4', respectively. Sub signal lines SSl 3 connect the via holes h4 of the via hole group H4 arranged on the regions S1' and S3' to the via holes h6 of the via hole group H6, respectively. Sub signal lines SSl 4 connect the via holes h4 of the via hole group H6 to the via holes h4 of the via hole group H4 arranged on the regions S2' and S4', respectively. The signal lines l 1, l 2, l 3 and l 4 are equal in length.

Transmission characteristics and transmission rate of a signal transferred from the memory control circuit 10 to the slot S1 are identical to those of a signal transferred from the memory control circuit 10 to the slot S2. Also, transmission characteristics and transmission rate of a signal transferred from the memory control circuit 10 to the slot S3 are identical to those of a signal transferred from the memory control circuit 10 to the slot S4. As a result, four slots show two different transmission characteristics, and therefore a difference of transmission characteristics of signals transferred between the memory control circuit and the slots is significantly reduced.

Figure 6:
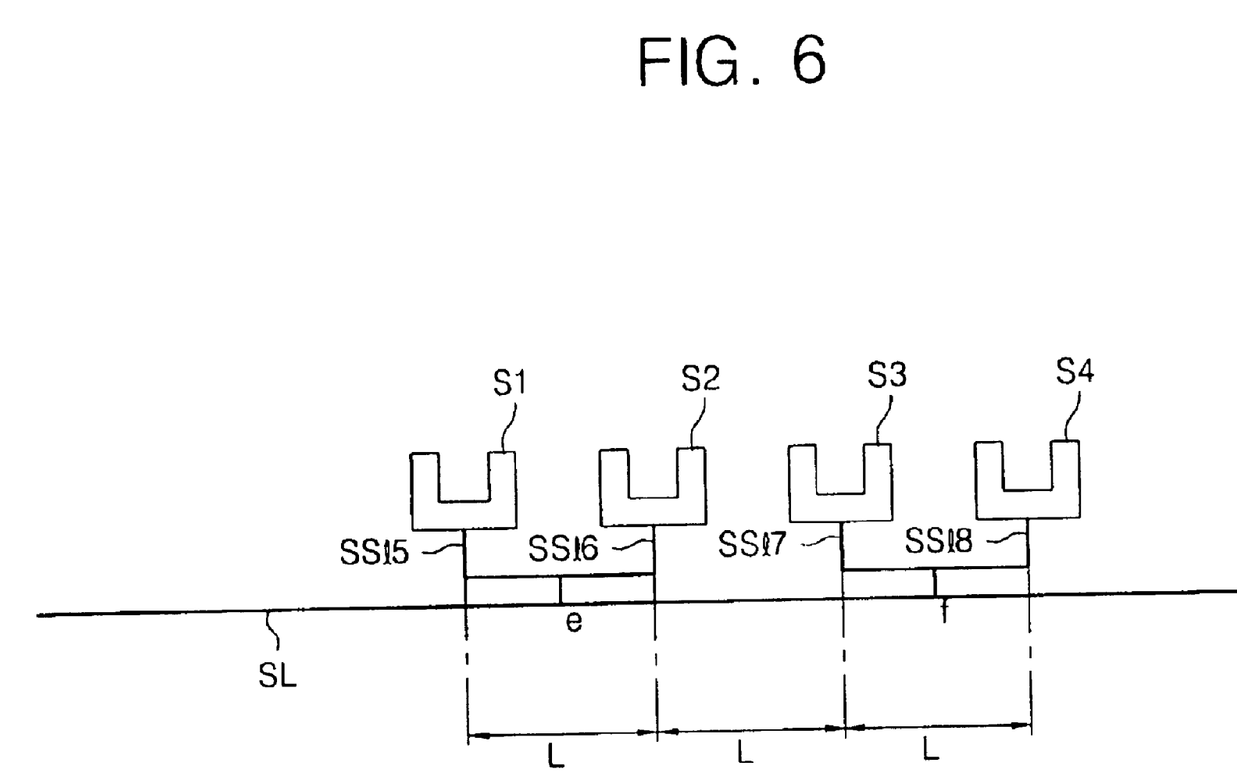
FIG. 6 shows a length of signal lines according to a location of slots according to one embodiment of the present invention.

FIG. 6 shows a length of the signal lines according to a location of the slots S1 to S4.

As shown in FIG. 6, a distance between the two adjacent slots is "L". The signal line SL is arranged under the slots S1 to S4 and is branched off at branch points "e" and "f". Sub signal lines SSl 5 and SSl 6 branched off at the branch point "e" are connected to the slots S1 and S2 and are equal in length. Sub signal lines SSl 7 and SSl 8 branched off at the branch point "f" are connected to the slots S3 and S4 and are equal in length.

A length of the signal line SL from the memory control circuit 10 to the branch point "e" differs from that from the memory control circuit 10 to the branch point "f". However, as compared to a signal line arrangement of the conventional system board, a difference between lengths of the signal lines to the slots is reduced, whereby a signal transmission rate and a signal transmission characteristic are significantly improved.

Figure 7A:
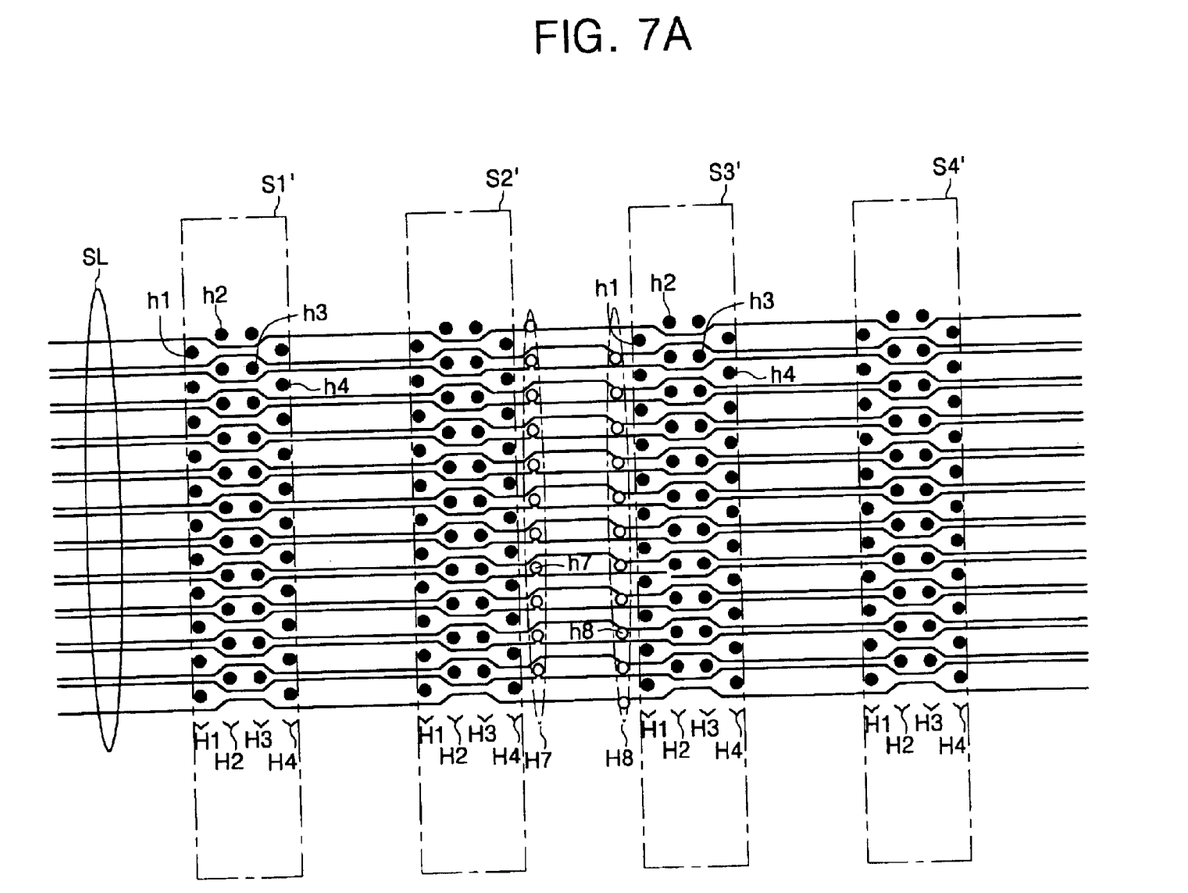
FIGS. 7A to 7C show upper and lower layers of a system board according to another embodiment of the present invention.
Figure 7B:
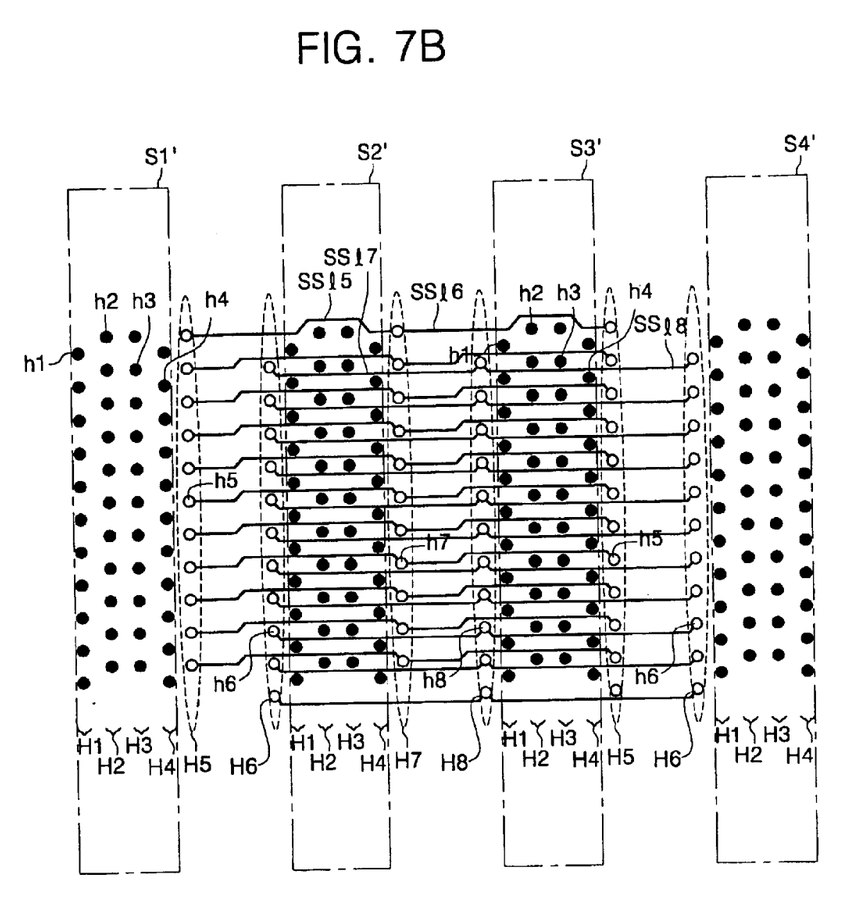
Figure 7C:
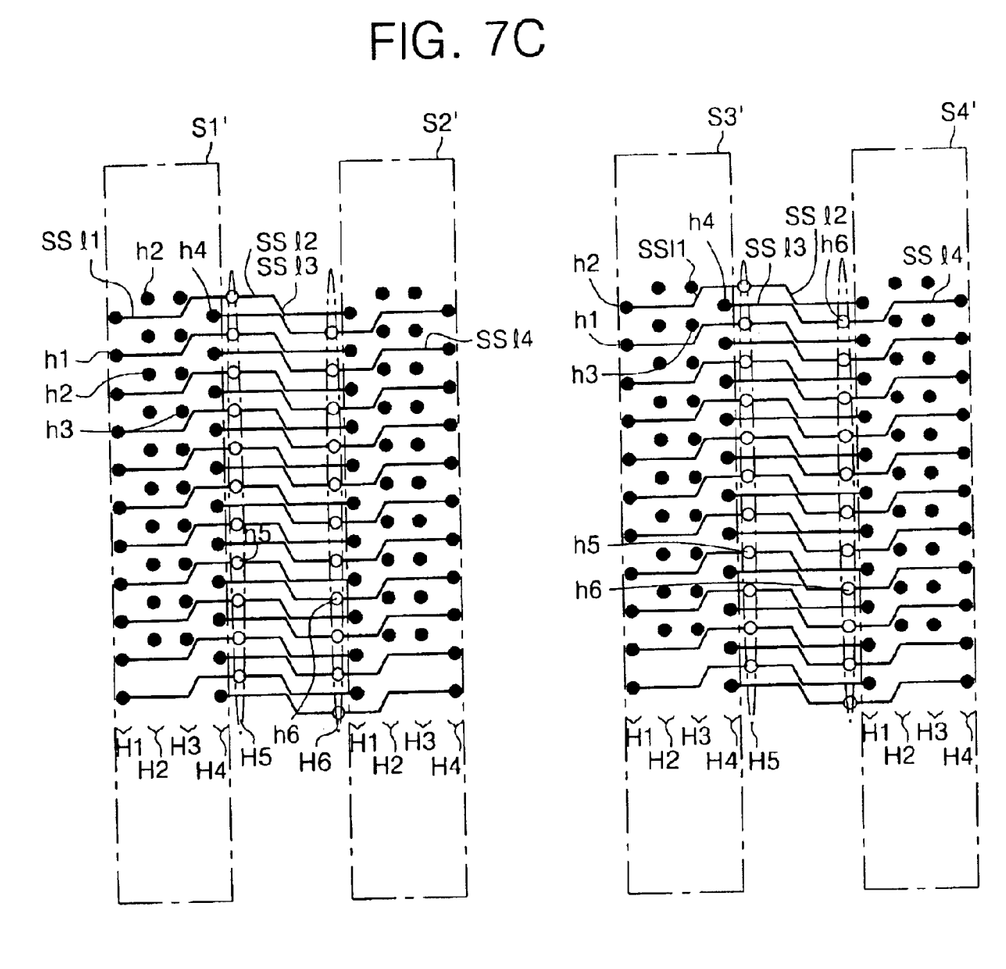

FIGS. 7A to 7C show upper and lower layers of a system board according to another embodiment of the present invention. FIGS. 7A and 7C show three signal line layers except a power voltage line layer and a ground voltage line layer.

Regions S1' to S4' denote regions in which the slots S1 to S4 each having 44 pins are mounted, respectively. Signal lines SL denote the main signal lines of FIG. 1. "h1 to h4" denote via holes arranged in a single row, and "H1 to H4" denote via hole groups each including 11 via holes h1 arranged in a single column. The via holes h1 and h4 are connected to the signal lines, and the via holes h2 and h3 are connected to ground voltage lines and power voltage lines, respectively. The via holes h1 to h4 are filled with a conductive material. Pins of each of the slots S1 to S4 are inserted into the via holes of the via hole groups H1 to H4, respectively, arranged on the regions S1' to S4', whereupon the signal lines SL1 and SL2 are connected to the slots S1 to S4, respectively.

In FIG. 7A, via holes h7 forming a via hole group H7 are arranged on the right side of the regions S2'. The via holes h7 are filled with the conductive material. Via holes h8 forming a via hole group H8 are arranged on the left side of the regions S3'. The via holes h8 are filled with the conductive material.

In FIG. 7B, via holes h5 forming a via hole group H5 are arranged on the right side of the regions S1' and S3'. Via holes h6 forming a via hole group H6 are arranged on the left side of the regions S2' and S4'. The via holes h5 and h6 are filled with the conductive material. Via holes h7 forming a via hole group H7 are arranged on the right side of the regions S2'. Via holes h8 forming a via hole group H8 are arranged on the left side of the regions S3'. The via holes h7 and h8 of FIG. 7B are to be connected to the via holes h7 and h8 of FIG. 7A, respectively.

The via holes h7 of the via hole group H7 arranged on the right side of the region S2' are connected to the via holes h5 of the via hole group H5 arranged on the right side of the region S1' through sub signal lines SSl 5 and are connected to the via holes h5 of the via hole group H5 arranged on the right side of the region S3' through sub signal lines SSl 6.

The via holes h8 of the via hole group H8 arranged on the left side of the region S3' are connected to the via holes h6 of the via hole group H6 arranged on the left side of the region S2' through sub signal lines SSl 7 and are connected to the via holes h6 of the via hole group H6 arranged on the left side of the region S4' through sub signal lines SSl 8. The sub signal lines SSl 5 to SSl 8 are identical in length.

In FIG. 7C, via holes h5 of a via hole group H5 are connected to the via holes h5 of the via hole group H5 of FIG. 7B, and via holes h6 of a via hole group H6 are connected to the via holes h6 of the via hole group H6 of FIG. 7B. That is, the via holes h5 of the via hole H5 and the via holes h6 of the via hole group H6 are connected to the main signal lines SL.

The via holes h5 of the via hole group H5 arranged on the right side of the regions S1' and S3' are connected to the via holes h1 of the via hole group H1 arranged on the regions S1' and S3' through sub signal lines SSl 1 and are connected to the via holes h1 of the via hole group H1 arranged on the regions S2' and S4' through sub signal lines SSl 2. The via holes h6 of the via hole group H6 arranged on the left side of the regions S2' and S4' are connected to the via holes h4 of the via hole group H4 arranged on the regions S1' and S3' through sub signal lines SSl 3 and are connected to the via holes h4 of the via hole group H4 arranged on the regions S2' and S4' through sub signal lines SSl 4. The sub signal lines SSl 1 to SSl 4 are identical in length.

Although this latter method for arranging signal lines of the system board according to another embodiment of the present invention requires one additional layer as compared to the former method of one embodiment of the present invention requiring two layers as described above, a length of signal lines from the memory control circuit 10 to the slots S1 to S4, numbers of branch points, and numbers and positions of the via holes are all identical for each slot. Accordingly, characteristics and time for transmitting signals is almost identical because loads of paths of the signal lines are identical.

Figure 8:
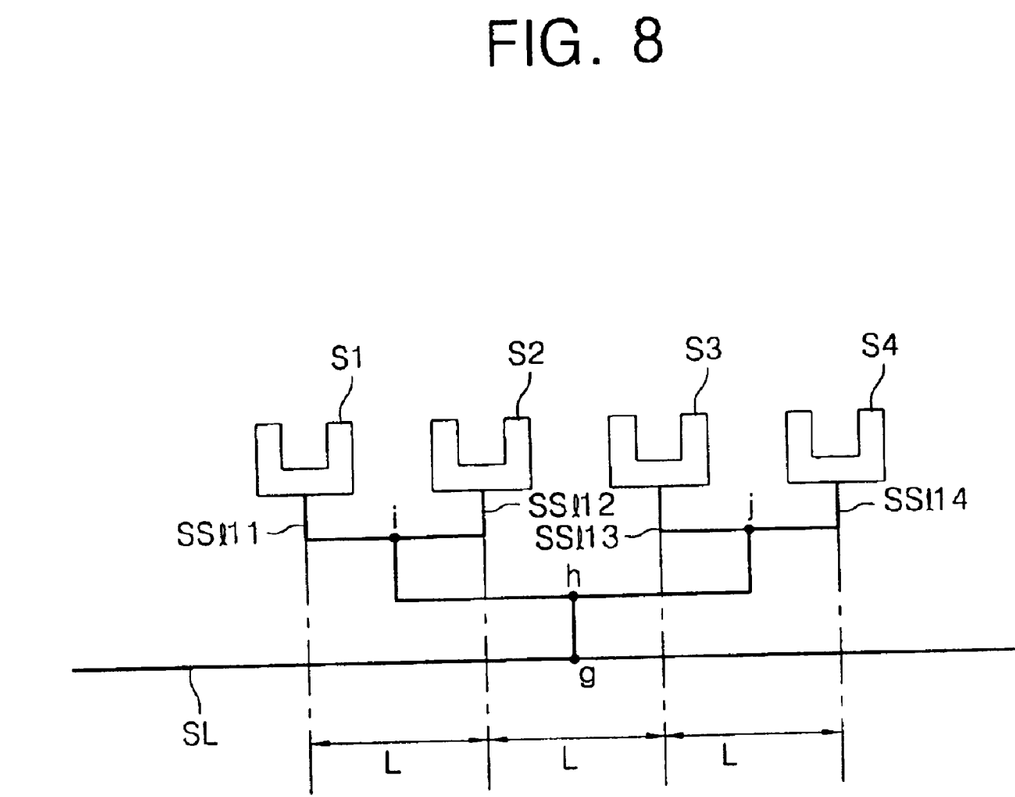
FIG. 8 shows a length of signal lines according to a location of slots according to another embodiment of the present invention.

FIG. 8 shows a length of the signal lines according to a location of the slots S1 to S4.

As shown in FIG. 8, a distance between the two adjacent slots is "L". The signal line SL is arranged under the slots S1 to S4. The signal line SL is firstly branched off at a branch point "g" and is secondly branched off at branch points "i" and "j". Sub signal lines SSl 11 to SSl 14 branched off at the branch points "i" and "j" are connected to the slots S1 to S4, respectively, and are equal in length.

Lengths from the memory control circuit 10 to the slots S1 to S4 are equal, and therefore there occurs no difference of a signal transmission rate and a signal transmission characteristic. Also, since the number and a location of the branch points and the via holes through which signals pass are equal for all slots, signals reaching the respective slots are transferred through the same path, whereupon waveforms of the signals inputted into or outputted from the respective slots become very uniform.

Figure 9A:
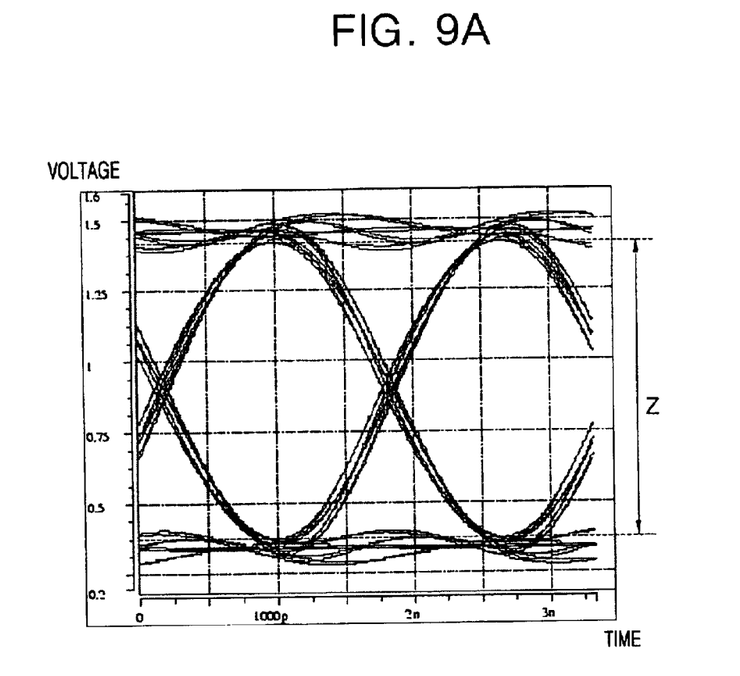
FIG. 9A is a graph illustrating a waveform of a signal transferred from a memory control circuit to a first slot according to the present invention.
Figure 9B:
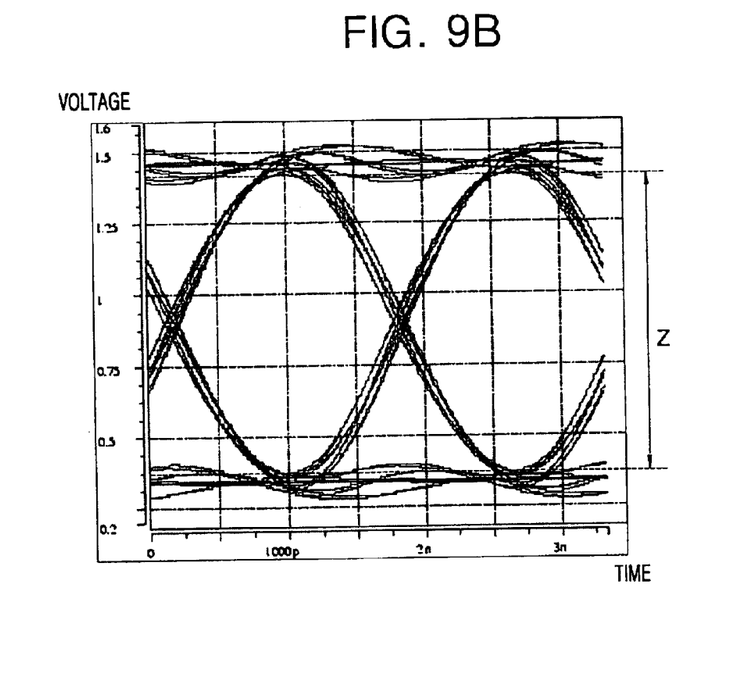
FIG. 9B is a graph illustrating a waveform of a signal transferred from the memory control circuit to a second slot according to the present invention.

FIG. 9A is a graph illustrating a waveform of a signal transferred from the memory control circuit to the first slot S1 according to the present invention. FIG. 9B is a graph illustrating a waveform of a signal transferred from the memory control circuit to the second slot S2 according to the present invention. In FIGS. 9A and 9B, a vertical axis denotes a voltage, and a horizontal axis denotes a time period.

Referring to FIG. 9A, a transmission rate transferred from the memory control circuit to the first slot S1 is slightly slow, whereas an amplitude of a signal voltage becomes greater, and therefore an eye opening "z" is greater. Accordingly, transmission characteristics of the signal transferred from the memory control circuit to the first slot S1 is excellent.

Referring to FIG. 9B, the waveform is identical to that of FIG. 9A. That is, a signal transferred from the memory control circuit to the slot S1 is almost identical in transmission rate and transmission characteristics to a signal transferred from the memory control circuit to the slot S2.

That is, signal transmission rate and signal transmission characteristics are significantly improved by reducing a difference of signal line lengths from the memory control circuit 10 to the slots S1 to S4 and a load difference of the signal lines.

In the embodiments of the present invention, signal lines are divided into two at one branch point. The signal lines can be divided into three or more at one branch point.

As described herein before, using the system board according to the present invention, signal transmission rate and signal transmission characteristics can be significantly improved by reducing a difference of signal line lengths from the memory control circuit to the slots and a load difference of the signal lines. Also, an operating speed of the system board can be improved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A system board, comprising:
    a control unit;
    connectors arranged in series in one direction and accepting a connecting means for inputting and outputting data; and
    signal lines connecting the control unit to the connectors and including at least one branch point,
    wherein sub signal lines branched off at the same branch point are equal in at least one of length and load of path from the branch point to the connecting means.

2. The board of claim 1, further comprising,
    a first layer including first via holes connected to the signal line, the first via holes arranged between regions in which the connectors are mounted; and
    a second layer including second via holes and third via holes, the second via holes arranged at a corresponding position of the first via holes and connected to the first via holes of the first layer, the third via holes arranged on the regions in which the connectors are mounted and connected to the second via holes through sub signal lines, respectively.

3. The board of claim 1, further comprising,
    a first layer including first via holes connected to the signal line, the first via holes arranged between regions in which the connectors are mounted;
    a second layer including second via holes and third via holes, the second via holes arranged at a corresponding position of the first via holes and connected to the first via holes of the first layer, the third via holes arranged on the regions in which the connectors are mounted, except positions in which the second via holes are arranged, and connected to the second via holes through first sub signal lines, respectively; and
    a third layer including fourth via holes and fifth via holes, the fourth via holes arranged at a corresponding position of the third via holes and connected to the third via holes of the second layer, the fifth via holes arranged on regions in which the connectors are mounted, except positons in which the fourth via holes are arranged, and connected to the fourth via holes through second sub signal lines, respectively.

4. The board of claim 1, wherein the signal lines include first and second branch points.

5. The board of claim 1, wherein the connectors are configured in a form of slot.

* * * * *